United States Patent
Makela et al.

(10) Patent No.: US 10,014,180 B1
(45) Date of Patent: Jul. 3, 2018

(54) TUNGSTEN GATE AND METHOD FOR FORMING

(71) Applicant: GLOBALFOUNDRIES Inc., Grand Cayman (KY)

(72) Inventors: Neal A. Makela, Saratoga Springs, NY (US); Vimal K. Kamineni, Mechanicville, NY (US); Pei Liu, Clifton Park, NY (US); Chih-Chiang Chang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/681,654

(22) Filed: Aug. 21, 2017

(51) Int. Cl.
| | |
|---|---|
| *H01L 21/285* | (2006.01) |
| *H01L 21/02* | (2006.01) |
| *H01L 21/3105* | (2006.01) |
| *H01L 29/423* | (2006.01) |

(52) U.S. Cl.
CPC .... *H01L 21/28568* (2013.01); *H01L 21/0217* (2013.01); *H01L 21/28556* (2013.01); *H01L 21/31055* (2013.01); *H01L 29/4238* (2013.01); *H01L 29/42364* (2013.01); *H01L 2029/42388* (2013.01)

(58) Field of Classification Search
CPC ............... H01L 21/28568; H01L 21/31055
See application file for complete search history.

(56) References Cited

U.S. PATENT DOCUMENTS

| | | | |
|---|---|---|---|
| 8,436,404 B2 | 5/2013 | Bohr et al. | |
| 9,018,711 B1 | 4/2015 | Cai et al. | |
| 9,379,221 B1 | 6/2016 | He et al. | |
| 2014/0349477 A1 | 11/2014 | Chandrashekar et al. | |
| 2015/0129934 A1* | 5/2015 | Xie | H01L 27/0886 257/192 |
| 2016/0225671 A1* | 8/2016 | Olac-Vaw | H01L 21/823821 |
| 2018/0053660 A1* | 2/2018 | Jandl | H01L 21/28562 |

* cited by examiner

*Primary Examiner* — Mounir Amer
(74) *Attorney, Agent, or Firm* — Francois Pagette; Hoffman Warnick LLC

(57) ABSTRACT

A structure and method for forming a tungsten region for a replacement metal gate (RMG). The method for forming the tungsten region may include, among other things, forming a first tungsten region i.e., tungsten seed layer, on a liner in a trench of a dielectric layer; removing a portion of the liner and the tungsten seed layer to expose an uppermost surface of a work function metal (WFM) layer wherein an uppermost surface of the liner and tungsten seed layer is positioned below an uppermost surface of the dielectric layer; and forming a second tungsten region from the tungsten seed layer. The tungsten region may be formed to contact the uppermost surface liner, the uppermost surface of WFM layer, and/or the sidewalls of the trench. The tungsten region may include a single crystallographic orientation. The tungsten region may also include an uppermost surface with a substantially arcuate cross-sectional geometry.

7 Claims, 6 Drawing Sheets

TUNGSTEN GATE AND METHOD FOR FORMING

BACKGROUND

The present disclosure relates to semiconductor device fabrication, and more specifically, to a replacement metal gate (RMG) and methods of forming the RMG, including forming a second tungsten region from a first tungsten region, i.e., tungsten seed layer.

Conventional integrated circuit (IC) (i.e., chip) formation generally occurs on the surface of a semiconductor substrate, e.g., silicon wafer. ICs may include a variety of interconnected devices such as resistors, transistors, capacitors, etc., formed on the surface of the semiconductor substrate. For example, an IC may include a metal-oxide-semiconductor (MOS) transistor which includes a polysilicon gate electrode. Although the use of polysilicon materials for the gate electrodes has its benefits (e.g., tolerating high temperature processing, facilitating the formation of self-aligned source and drain structures, etc.), the high resistivity of the materials results in gate electrodes which operate at slower speeds as compared to gates made of materials such as metal. One conventional method for improving the speed of the gate electrodes while also continuing to enjoy the benefits of polysilicon materials includes forming a disposable polysilicon gate for use during high temperature processing, and subsequently replacing the polysilicon gate with a lower resistance metal gate using a replacement metal gate (RMG) process.

As IC dimensions shrink, materials with lower resistivity such as tungsten (W) are utilized for replacements gates in RMG processes in order to account for the increased gate resistance associated with the dimension reduction of the gate. One challenge associated with incorporating lower resistance metals such as tungsten (W) in an RMG process may include damage to the low resistance metal caused during the RMG process. Turning to the figures, FIG. 1 shows a semiconductor structure 100 including a dielectric layer 106 on a substrate 102. Substrate 102 may include doped source/drain regions 104, and dielectric layer 106 may include a trench 108. Semiconductor structure 100 also includes a variety of structures formed in trench 108, including a work function metal (WFM) layer 110, a liner 112, a tungsten (W) gate 114, and a cap 116. During conventional processing, portions 118, 120 (in phantom) of liner 112 and tungsten gate 114, respectively, are removed to expose an upper surface 122 of WFM layer 110 positioned below an upper surface 126 of dielectric layer 106. Portions 118, 120 may be removed, for example, to allow cap 116 to be formed within trench 108. Cap 116 may then be formed on the WFM layer, liner and tungsten gate in trench 108. Portions 118, 120 of liner and tungsten gate may be removed, for example, by a chemical-mechanical planarization (CMP) process for planarization, and a reactive ion etching (RIE) process for removing the remainder of portions 118,120. The removal of portion 120 of tungsten gate 114 by CMP and/or RIE may render the semiconductor device inoperable. For example, removal of portion 120 may physically damage the tungsten gate, increase the resistivity of the tungsten gate, and/or cause non-uniformities between tungsten gates across the semiconductor structure.

SUMMARY

A first aspect of the disclosure is directed to an integrated circuit (IC) structure including: a dielectric layer on a substrate; a work function metal (WFM) layer in a trench in the dielectric; a liner on the WFM layer in the trench, the liner having an uppermost surface positioned below an uppermost surface of the dielectric layer; and a tungsten region having a single crystallographic orientation, the tungsten region positioned on the liner, and wherein the tungsten region contacts the uppermost surface of the liner.

A second aspect of the disclosure is related to a method of forming an integrated circuit (IC) structure, the method including: forming a trench in a dielectric layer on a substrate; forming a work function metal (WFM) layer in the trench, wherein an uppermost surface of the WFM layer is positioned below an uppermost surface of the dielectric layer; forming a liner on the WFM layer in the trench; forming a tungsten seed layer on the liner; removing a portion of the liner and a portion of the tungsten seed layer to expose the uppermost surface of the work function metal layer, and wherein an uppermost surface of the liner is positioned below the uppermost surface of the dielectric layer after the removing the portion of the liner; and forming a second tungsten region from the tungsten seed layer.

A third aspect of the disclosure is related to a method of forming a replacement metal gate for an integrated circuit (IC) structure, the method including: forming a dielectric layer on a substrate; forming a trench in the dielectric layer; forming a work function metal (WFM) layer in the trench, wherein an uppermost surface of the WFM layer is positioned below an uppermost surface of the dielectric layer; forming a liner on the WFM layer in the trench; forming a tungsten seed layer on the liner; removing a portion of the liner and a portion of the tungsten seed layer to expose the uppermost surface of the work function metal layer, and wherein an uppermost surface of the liner is positioned below the uppermost surface of the dielectric layer after the removing the portion of the liner; forming a second tungsten region from the tungsten seed layer, wherein the second tungsten region contacts the uppermost surface of the liner and a sidewall of the of the trench; and forming a cap layer over the tungsten layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a structure and method for forming a second tungsten region from a first tungsten region i.e., tungsten seed layer, in a trench of a semiconductor structure for a replacement metal gate (RMG). Among other things, the second tungsten region includes a single crystallographic orientation. The second tungsten region may contact an uppermost surface of a liner in the trench, an uppermost surface of a work function metal (WFM) layer in the trench, and/or sidewalls of the trench. Methods of forming the second tungsten region may include, among other things, forming a first tungsten region i.e., a tungsten seed layer, on a liner in a trench, removing a portion of the liner and tungsten seed layer, and forming the second tungsten region from the remaining portion of the tungsten seed layer. Embodiments of the present disclosure may mitigate and/or correct physical damage caused to the tungsten seed layer during etching of the tungsten seed layer for forming the RMG. Embodiments of the present disclosure may also mitigate and/or correct non-conformities among tungsten regions of RMGs in a semiconductor structure caused during conventional RMG formation. Embodiments of the present disclosure may also lower the resistivity of the RMG compared to an RMG formed by conventional processes.

Figure 2:
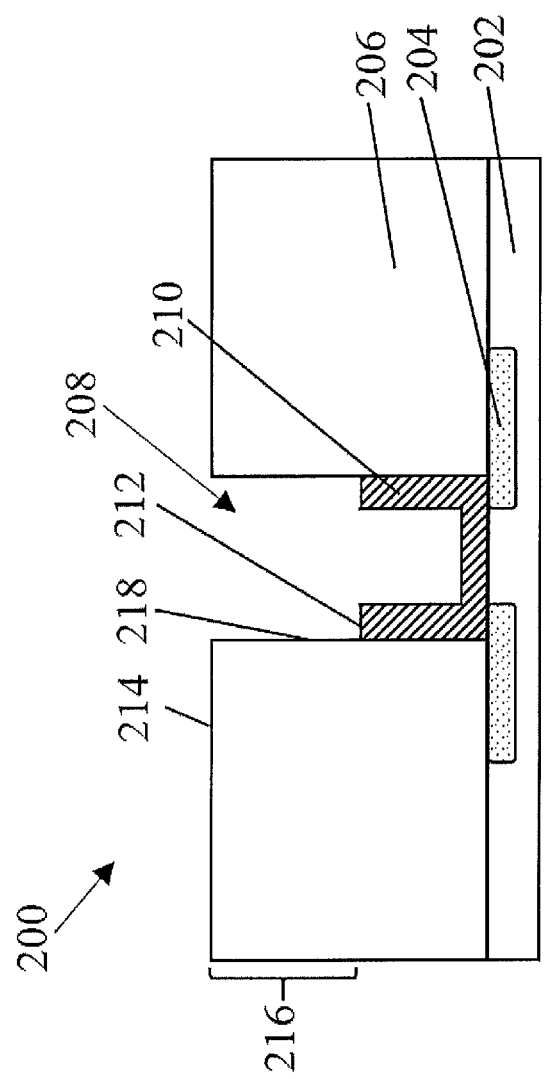
FIG. 2 shows a cross-sectional view of forming a work function metal (WFM) in a trench of a semiconductor structure for forming a replacement metal gate (RMG), according to embodiments of the disclosure.

Referring to the figures, FIG. 2 shows forming a work function metal (WFM) layer 210 on a semiconductor structure 200 for forming a second tungsten region 232 (see FIG. 5), according to embodiments of the disclosure. Semiconductor structure 200 may include doped source/drain regions 204 in a substrate 202. Semiconductor structure 200 may also include a dielectric layer 206 formed on substrate 202. A trench 208 may be formed in dielectric layer 206 to substrate 202. The WFM layer 210 may be formed within trench 208.

Substrate 202 including doped source/drain regions 204 may be formed using any now known or later developed semiconductor fabrication techniques for forming a doped region in a substrate. Substrate 202 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of each layer may be strained. Doped source/drain regions 204 may include, for example, an n-doped region or a p-doped region of substrate 202.

Turning to dielectric layer 206, the dielectric layer may be formed on substrate 202 by any now known or later developed semiconductor manufacturing techniques for forming a dielectric layer. For example, dielectric layer 206 may be formed by deposition on substrate 202. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. Dielectric layer 206 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

As discussed above, trench 208 may be formed, for example, in dielectric layer 206 to substrate 202. Trench 208 may include sidewalls 218. Although one trench is shown, it is understood that any number of trenches desirable for a semiconductor device may be formed. Trench 208 may be formed in dielectric layer 206 by any now known or later developed semiconductor manufacturing techniques for forming a trench in a dielectric layer. For example, trench 208 may be formed by patterned etching of dielectric layer 206, e.g., using a patterned mask (not shown). Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

As shown in the example of FIG. 2, WFM layer 210 may be formed in trench 208. An uppermost surface 212 of WFM layer 210 may be positioned, for example, below an uppermost surface 214 of dielectric layer 206 leaving portions 216 of sidewalls 218 of trench 208 exposed. WFM layer 210 may be formed in trench 208, for example, by deposition and patterned etching, and/or any now known or layer developed semiconductor manufacturing techniques for forming a WFM layer. WFM layer 210 may include, for example, titanium nitride (TiN), Titanium Silicon Nitride (TiSiN), titanium carbide (TiC), titanium aluminide carbide (TiAlC), tantalum aluminide carbide (TaAlC), TaSiAlC, tantalum nitride (TaN), tungsten nitride (WN), tungsten carbide (WC), WCN, and/or any other now known or later developed WFM materials, and/or any combination thereof. Although not shown, WFM layer 210 may include, for example, multiple layers. For example, WFM layer 210 may include three layers including a layer of TiN, a layer of TiAlC, and another layer of TiN. Where WFM 210 is includes multiple layers, WFM 210 may be formed, for example, by in-situ deposition and/or any other now known or later developed semiconductor manufacturing technique for forming a multilayer WFM layer.

Figure 3:
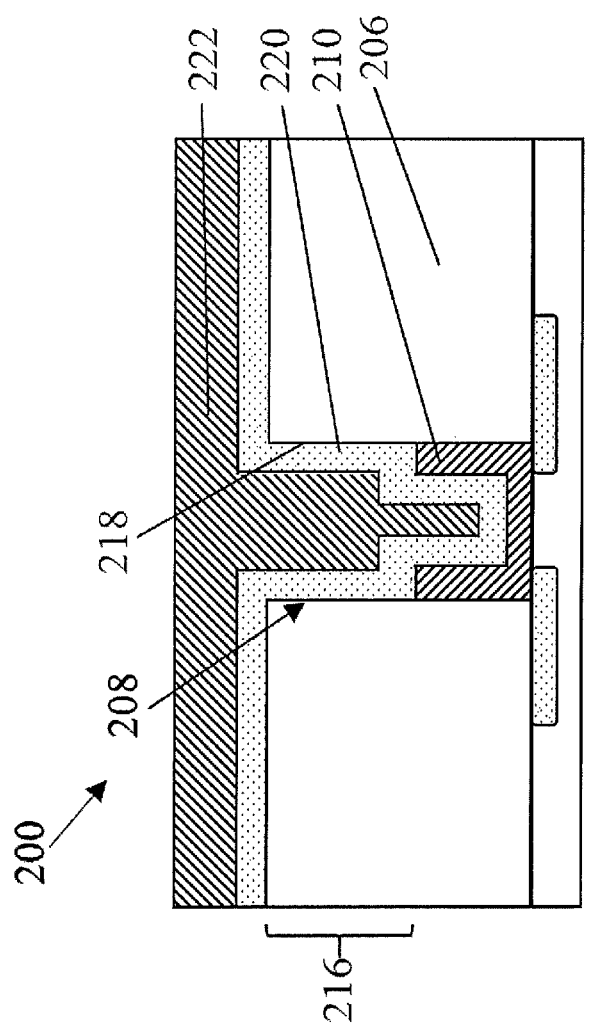
FIG. 3 shows a cross-sectional view of forming a liner and tungsten seed layer on the structure of FIG. 2 for forming the RMG, according to embodiments of the disclosure.

FIG. 3 shows forming a liner 220 and a first tungsten region, i.e., tungsten seed layer 222, in trench 208 of semiconductor structure 200 for forming second tungsten region 232 (see FIG. 5), according to embodiments of the disclosure.

Liner 220 may be formed, for example, on WFM layer 210, portions 216 of sidewalls 218 of trench 208 and uppermost surface 214 of dielectric layer 206. Liner 220 may be formed, for example, by deposition and/or any other now known or later developed semiconductor manufacturing techniques for forming a liner. Liner 220 may include, for example, titanium nitride (TiN), tantalum nitride (TaN), tantalum (Ta), titanium (Ti), tungsten (W), tungsten nitride (WN), tungsten carbide (WC), WCN, and/or any other now known or later developed liner materials.

Tungsten seed layer 222 may be formed, for example, on liner 220 above WFM layer 210 and dielectric layer 206. Tungsten seed layer 222 may be formed by any now known or layer developed semiconductor manufacturing techniques for forming a tungsten layer. For example, tungsten seed layer 222 may be formed by deposition, e.g., chemical vapor deposition (CVD).

Figure 4:
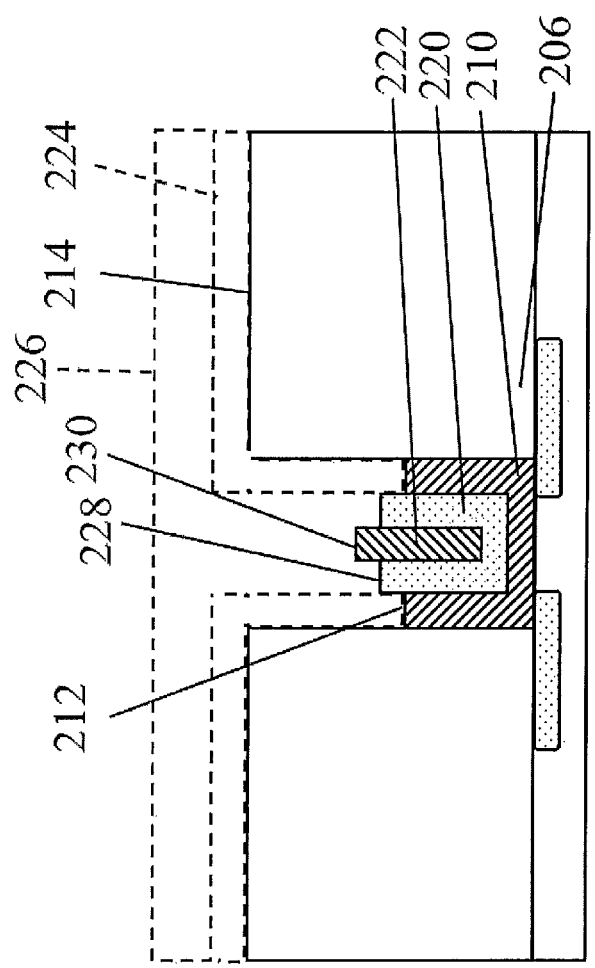
FIG. 4 shows a cross-sectional view of removing a portion of the liner and tungsten seed layer of FIG. 4 for forming the RMG, according to embodiments of the disclosure.

FIG. 4 shows removing portions 224, 226 of liner 220 and tungsten seed layer 222, respectively, for forming a second tungsten region 232 (see FIG. 5), according to embodiments of the disclosure. For example, portion 224 of liner 220 and portion 226 of tungsten seed layer 222 may be removed to expose uppermost surface 212 of WFM layer 210. After removing portion 224 of liner 220, an uppermost surface 228 of the liner may be positioned, for example, below uppermost surface 214 of dielectric layer 206. After removing portion 226 of tungsten seed layer 222, an uppermost surface 230 of the tungsten seed layer may also be positioned, for example, below uppermost surface 214 of dielectric layer 206.

Portions 224, 226 of liner 220 and tungsten seed layer 222 may be removed by any now known or later developed semiconductor manufacturing processes for removing a liner and/or tungsten layer. In one non-limiting example, removing portions 224, 226 of liner 220 and tungsten seed layer 222 may include a chemical-mechanical planarization (CMP) process to planarize liner 220 and tungsten seed layer 222, and a patterned etching process (e.g., reactive ion etching (RIE)) to remove the remainder of portions 224, 226 of liner 220 and tungsten seed layer 222.

Figure 1:
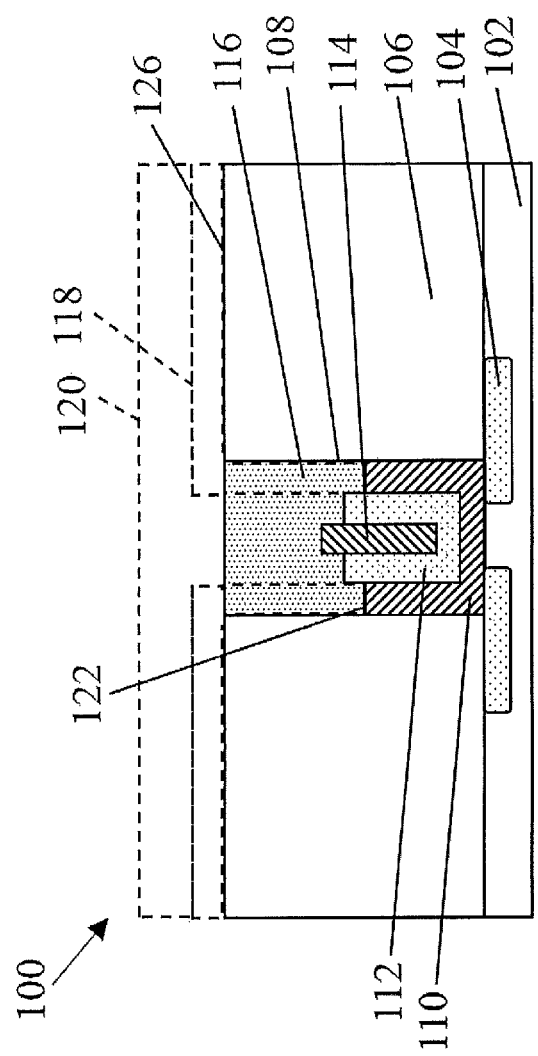
FIG. 1 shows a cross-sectional view of a conventional replacement metal gate.
Figure 5:
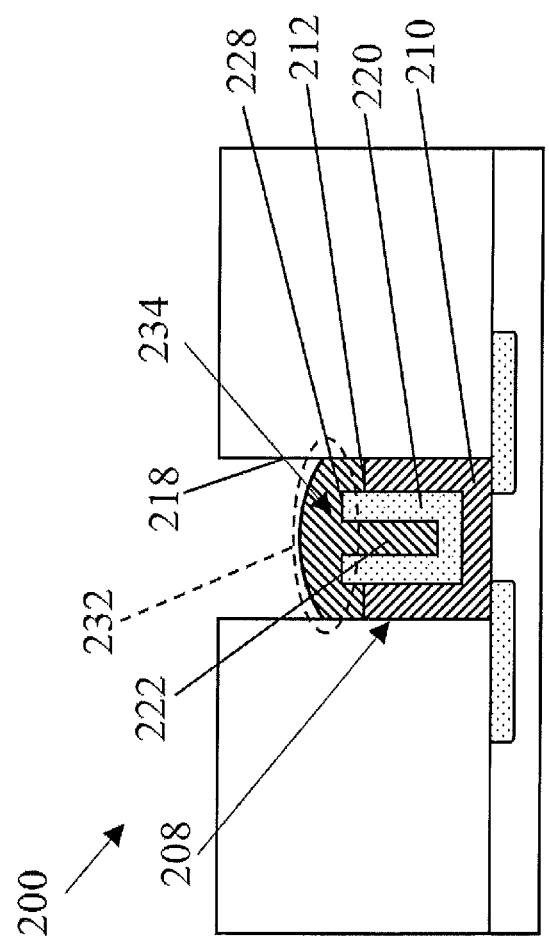
FIG. 5 shows a cross-sectional view of forming a tungsten region from the tungsten seed layer of FIG. 5 for the RMG, according to embodiments of the disclosure.

At this stage in conventional RMG formation, a cap layer (e.g., cap layer 116 of FIG. 1) would be formed above tungsten seed layer 222, liner 220 and WFM layer 210 in trench 208. In contrast to conventional RMG formation, FIG. 5 shows forming second tungsten region 232 (in phantom) from the remainder of tungsten seed layer 222, before forming cap layer 236 (see FIG. 6). Second tungsten region 232 may be formed, for example, to contact uppermost surface 228 of liner 220, uppermost surface 212 of WFM layer 210 and/or sidewalls 218 of trench 208. For example, although not shown, second tungsten region 232 may be formed to contact only uppermost surface 228 of liner 220. In another non-limiting example not shown, second tungsten region 232 may be formed, to contact only uppermost surface 228 of liner 220 and a portion of uppermost surface 212 of WFM layer 210.

Conventional processes for forming a metal region (e.g., second tungsten region 232) from a seed layer may include forming a nucleation layer (not shown) on the seed layer before forming the metal region. Forming the nucleation layer may reduce the metal precursor to its natural form, reduce the growth delay for the metal region, and allow for growth of the metal region from a material not containing the metal. In contrast to conventional processes for forming a metal region from a seed layer, forming second tungsten region 232 may include omitting the formation of a nucleation layer. For example, forming second tungsten region 232 from tungsten seed layer 222 as described herein may include omission of the use of diborane ($B_2H_6$) and/or silane ($SiH_4$) which may be conventionally used for nucleation. Where the nucleation layer formation is omitted, second tungsten region 232 may be formed, for example, directly from tungsten seed layer 222 (i.e., without forming from liner 220, WFM layer 210, and sidewalls 218 of trench 208). Further as shown in FIG. 5, where the nucleation process is omitted and second tungsten region 232 is formed directly from tungsten seed layer 222, second tungsten region 232 may include a single crystallographic orientation, and an uppermost surface 231 including a substantially arcuate cross-sectional geometry.

Second tungsten region 232 may be formed, for example, by any now known or later developed semiconductor manufacturing techniques for forming a tungsten region from a tungsten seed layer. For example, second tungsten region 232 may be formed by a selective chemical vapor deposition (CVD) process on tungsten seed layer 222. The selective CVD process may be performed, for example, at a pressure of approximately 5 Torr (T) to approximately 90 T; a temperature of approximately 200 degrees Celsius (° C.) to approximately 400° C.; and a time span of approximately 1 second to approximately 500 seconds. Further, the selective CVD process may include, for example, flowing $H_2$ and a tungsten precursor, e.g., $WF_6$, at substantially the same time. In another non-limiting example, second tungsten region 232 may be formed using an atomic layer deposition (ALD) process. The formation of second tungsten region 232 by selective CVD and/or ALD may further include, for example, the use of a precursor such as $WF_6$, a metalorganic tungsten precursor, halide precursor (e.g., $WCl_5$ or $WCl_6$), etc. The size of second tungsten region 232 may, for example, be proportional to the duration of the formation process.

Forming second tungsten region 232 according to embodiments of the disclosure may, for example, mitigate and/or correct the damage caused to tungsten seed layer 222 during removal of portion 226 thereof (see FIG. 4). Further, forming second tungsten region 232 according to embodiments of the disclosure may, for example, mitigate and/or correct non-uniform tungsten regions across a semiconductor structure caused by conventional methods. Forming second tungsten region 232 according to embodiments of the disclosure may also, for example, reduce the resistivity of RMG 234 compared to tungsten gate 114 of FIG. 1.

Figure 6:
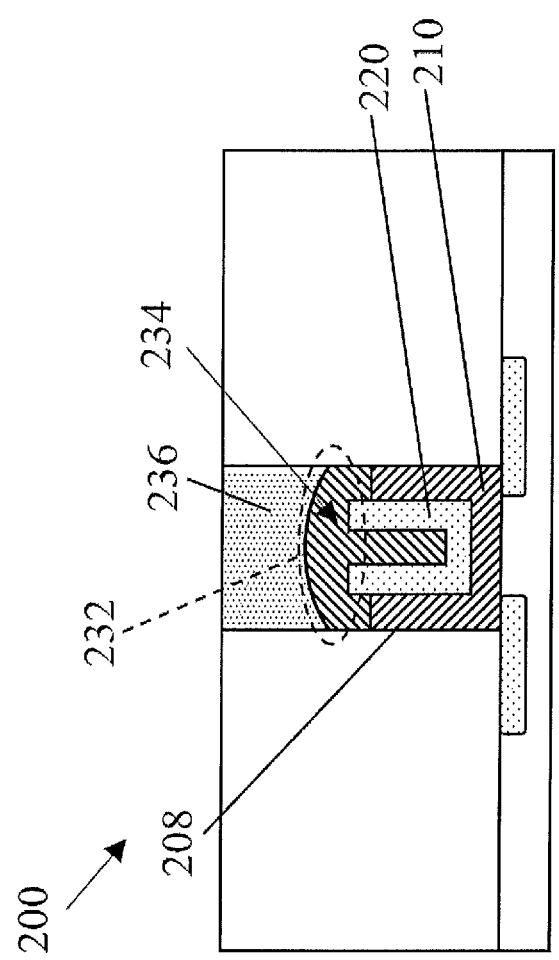
FIG. 6 shows a cross-sectional view of forming a cap layer over the RMG of FIG. 5, according to embodiments of the disclosure.

FIG. 6 shows forming a cap layer 236 in trench 208 above RMG 234 after forming second tungsten region 232, according to embodiments of the disclosure. Cap layer 236 may be formed, for example, as a protective barrier for second tungsten region 232. Cap layer 236 may be formed by deposition and/or any other now known or later developed semiconductor manufacturing technique for forming a cap layer. Cap layer 236 may include, for example, a dielectric material such as Silicon Nitride (SiN), and/or any other now known or later developed material for a cap layer.

The method as described above is used in the fabrication of integrated circuit chips. The method and structure is not limited to planar transistor technology and may be used, for example, in Fin Field Effect Transistor (FinFET) technology, etc. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
   a dielectric layer on a substrate;
   a work function metal (WFM) layer in a trench in the dielectric layer;
   a liner on the WFM layer in the trench, the liner having an uppermost surface positioned below an uppermost surface of the dielectric layer; and
   a tungsten region having a single crystallographic orientation, the tungsten region positioned on the liner, and wherein the tungsten region contacts the uppermost surface of the liner.

2. The IC structure of claim 1, wherein the tungsten region also contacts a sidewall of the trench.

3. The IC structure of claim 1, wherein the WFM layer includes titanium nitride (TiN) and titanium aluminide carbide (TiAlC).

4. The IC structure of claim 1, wherein the liner includes titanium nitride.

5. The IC structure of claim 1, further comprising a cap layer over the tungsten region.

6. The IC structure of claim 5, wherein the cap layer includes silicon nitride.

7. The IC structure of claim 1, wherein a cross-sectional geometry of an uppermost surface of the tungsten region is substantially arcuate.

* * * * *